United States Patent [19]
Sugai et al.

[11] Patent Number: 5,545,591
[45] Date of Patent: Aug. 13, 1996

[54] METHOD FOR FORMING AN ALUMINUM FILM USED AS AN INTERCONNECT IN A SEMICONDUCTOR DEVICE

[75] Inventors: Kazumi Sugai; Hidekazu Okabayashi; Shunji Kishida, all of Tokyo, Japan

[73] Assignee: NEC Corporation, Tokyo, Japan

[21] Appl. No.: 554,029

[22] Filed: Nov. 6, 1995

Related U.S. Application Data

[63] Continuation of Ser. No. 182,472, Jan. 28, 1994, abandoned.

[30] Foreign Application Priority Data

Jan. 29, 1993 [JP] Japan .................................. 5-012979

[51] Int. Cl.$^6$ .................................................. H01L 21/283
[52] U.S. Cl. ........................... 437/192; 437/194; 437/195; 427/252
[58] Field of Search ..................................... 437/187, 190, 437/192, 194, 197, 198, 199; 427/252

[56] References Cited

U.S. PATENT DOCUMENTS

| | | |
|---|---|---|
| 3,375,129 | 3/1968 | Carley et al. |
| 4,923,717 | 5/1990 | Gladfelter et al. ........ 427/252 |
| 5,151,305 | 9/1992 | Matsumoto et al. ...... 427/252 |
| 5,364,664 | 11/1994 | Tsubouchi et al. ....... 427/535 |

FOREIGN PATENT DOCUMENTS 1-252776  10/1989  Japan .................................. 427/252

OTHER PUBLICATIONS

Wolf, Silicon Processing, vol. 2, Lattice Press, 1990, pp. 121–133.

K. Tsubouchi et al., "Selective and Nonselective Deposition of Aluminum by LPCVD Using DMAH and Microregion Observation of Single Crystal Aluminum With Scanning –Rheed Microscope", 1990 IEEE Symposium on VLSI Technology, Digest of Technical Papers.

*Primary Examiner*—T. N. Quach
*Attorney, Agent, or Firm*—Young & Thompson

[57] ABSTRACT

A method for forming an interconnect comprises the steps of first covering an overall surface including a surface of a contact hole or a via-hole with a film of one of refractory metal and refractory metal compound and then depositing on the covered surface an aluminum film grown by a chemical vapor deposition (CVD) process using organic aluminum or trialkylamine-alane as a source material under a substrate temperature between 100° C. and 180° C. The organic aluminum is one of dimethylaluminum hydride, tri-isobutyl aluminum, trimethylamine-alane, and diethylaluminum hydride. The trialkylamine-alane is one of trimethylamine-alane and triethylamine-alane. Such aluminum film has good step-coverage so that, even when the diameter is small and the aspect ratio is high, the film can be deposited without an void being formed in the deposited film in the contact hole or the via-hole.

7 Claims, 2 Drawing Sheets

METHOD FOR FORMING AN ALUMINUM FILM USED AS AN INTERCONNECT IN A SEMICONDUCTOR DEVICE

This application is a continuation of application Ser. No. 08/187,472, filed Jan. 28, 1994, now abandoned.

BACKGROUND OF THE INVENTION

1. Field of the Invention

The present invention relates to a method for forming an interconnect, and more particularly to a method for forming an aluminum film used as an interconnect in a semiconductor device.

2. Description of the Related Art

An example of conventional methods for forming an aluminum film used as an interconnect in a semiconductor device is one in which, by means of sputtering or evaporation, atoms or molecules of aluminum struck out from an aluminum target are deposited on a substrate surface. In another example, as reported in 1990 Symposium on VLSI Technology, Digest of Technical Papers, page 5, an aluminum film is deposited on a titanium nitride under a substrate temperature between 230° C. to 350° C. by a low-pressure chemical vapor deposition (LP-CVD) using dimethylaluminum hydride as a source material.

The conventional method for forming interconnects described above suffers from problems in that, in a method for forming an aluminum film for interconnects by sputtering or evaporation, the step-coverage is poor within a contact hole or via-hole which is formed on a substrate surface and which has an aspect ratio larger than 1. This leads to the lowering of reliability of semiconductor devices since the interconnects patterned from the film with the poor step-coverage may involve a non-conduction problem or be fused away due to an increase in the current density.

In a method for forming an aluminum film for interconnects by the low-pressure CVD process, since it is required that the deposition rate be made as high as possible in order to enhance the productivity, the film formation must be performed under a high substrate temperature. Under such condition, when the source molecules of dimethylaluminum hydride reach the substrate surface, most of them decompose and form an aluminum film. Where such a method is applied to the filling of the contact hole or via-hole that has a high aspect ratio and a small diameter, the source molecules reach the bottom of the hole by repeating impingements on sidewalls since the mean free path of the source molecules is longer than the diameter. In this case, since the substrate temperature is high, the source molecules decompose thereby forming a film after the impingement once or twice, so that the practical source material flux at the bottom of the contact hole becomes smaller than that at the upper portion of the contact hole. As the film formation progresses, the diameter of the upper portion of the contact hole or the via-hole becomes smaller due to the film deposited thereat and this makes it more difficult to supply the source material to the bottom portion of the contact holes or the via-holes. This results in the formation of an undesirable void at the bottom portion thereof, in the electrical non-conduction, and in the interconnect fusion due to an increase in the current density thereat, whereby the reliability of semiconductor devices is lowered.

SUMMARY OF THE INVENTION

An object of the present invention is to overcome the problems existing in the conventional methods explained above and to provide an improved method for forming an interconnect which enhances the reliability of semiconductor devices.

Another object of the present invention is to provide a method for forming an interconnect by depositing an aluminum film having good step-coverage within a contact hole or a via-hole having a small diameter and a high aspect ratio.

Still another object of the present invention is to provide a method for forming an interconnect, capable of fully covering the inside surface of the contact hole or the via-hole without leaving a void in the film which leads to an electrically defective interconnect.

According to one aspect of the invention, there is provided a method for forming an interconnect, the method comprising the steps of:

providing a contact hole or a via-hole on a surface of a semiconductor substrate;

covering a surface including a surface of the contact hole or the via-hole with a film of one of refractory metal and refractory metal compound; and depositing on the covered surface an aluminum film grown by a chemical vapor deposition process using organic aluminum as a source material under a substrate temperature between 100° C. and 180° C.

In practice, calculation is made of a deposition rate by which an aluminum film is deposited within a contact hole by a CVD process using an organic aluminum as a source material and of a deposition rate by which an aluminum film is deposited on a surface outside the contact hole or the via-hole. It is assumed that, since the aspect ratio of the contact hole or the via-hole on the semiconductor substrate is large, most of the organic aluminum source molecules reach the bottom of the contact hole or the via-hole by repeating impingements on sidewalls of the contact hole or the via-hole, and once the source molecules enter the contact hole or the via-hole they all decompose and form an aluminum film. On the other hand, it is assumed that the source molecules that reached the surface other than that of the contact hole or the via-hole decompose by dependence solely on reactive sticking coefficient and form an aluminum film. The surface area $S_H$ within the contact hole or the via-hole will be:

$$S_H = \pi r^2 + 2\pi r d$$

wherein r is the radius of the contact hole and d is the depth of the contact hole or the via-hole. Since the source material is supplied to inside the contact hole or the via-hole through the opening portion of the contact hole or the via-hole, the effective flux of the source molecules at the surface within the contact hole or the via-hole becomes $\pi r^2/S_H$ times smaller than the source material flux at the surface outside the contact hole. Therefore, the growth rate $D_H$ of the film inside the contact hole becomes:

$$D_H = \phi \pi r^2 / (\pi r^2 + 2\pi r d)$$

wherein $\phi$ is the source material flux per unit area at the substrate surface outside the contact hole or the via-hole. The growth rate $D_S$ of the film at the surface outside the contact hole or the via-hole becomes:

$$D_S = S_C \phi$$

wherein $S_C$ is the reactive sticking coefficient. In order to fill inside the contact hole or the via-hole with the film having the uniform thickness, it is necessary to make $D_H$ and $D_S$ equal with each other. Thus, the reactive sticking coefficient becomes:

$$S_C=1/(1+4\alpha) \tag{1}$$

wherein $\alpha$ is the aspect ratio $d/2r$ of the contact hole or the via-hole. In actual application, all the source material that entered the contact hole or the via-hole does not necessarily decompose so that it facilitates the filling of the contact hole or the via-hole if the reactive sticking coefficient is lower still than the value obtained by the equation (1) above. Since the reactive sticking coefficient when the deposition rate is maximum at the surface outside the contact hole or the via-hole is assumed as 1, the reactive sticking coefficient under a certain substrate temperature can be considered the ratio of the deposition rate under such temperature to the maximum deposition rate obtained when the film formation conditions other than the substrate temperature are the same. Therefore, in order to fill inside the contact hole or the via-hole, it is necessary to select the substrate temperature such that relationship between the deposition rate $D_r$ and the maximum deposition rate $D_m$ becomes:

$$D_r \leq D_m/(1+4\alpha). \tag{2}$$

That is, the temperature of the deposition rate $1/(1+4\alpha)$ times the upper limit of the temperatures for performing the filling of the contact hole or the via-hole.

The inventors have found that, by depositing an aluminum film on a surface of a refractory metal or refractory metal compound film by a CVD process using organic aluminum as a source material, it is possible to deposit the aluminum film under a substrate temperature lower by more than 100° C. as compared with the case wherein the aluminum is deposited directly on, for example, a silicon layer.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENTS OF THE INVENTION

Now, a preferred embodiment of the invention is explained with reference to the accompanying drawings.

Figure 1A:
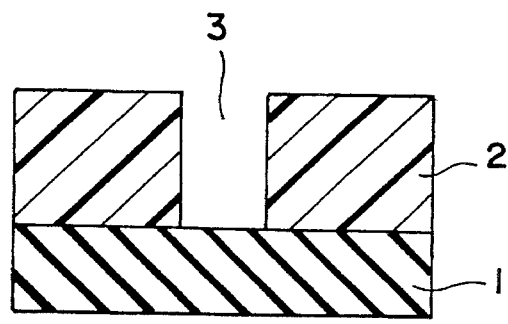
FIGS. 1A, 1B and 1C are cross-sectional views of a semiconductor chip for explaining the sequential process steps of a method of the embodiment according to the invention.
Figure 1B:
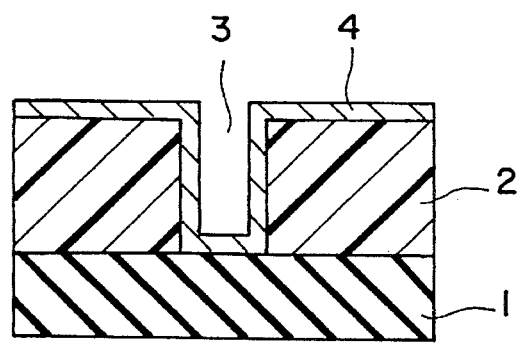
Figure 1C:
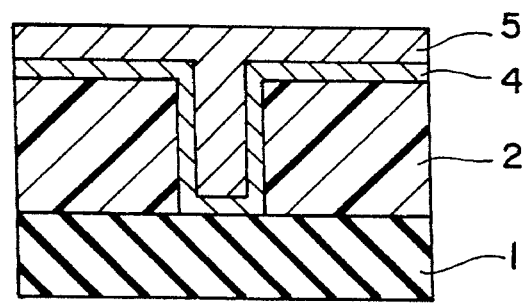

FIGS. 1A, 1B and 1C are for explaining the sequential process steps of the fabrication of the silicon LSIs according to the invention.

As shown in FIG. 1A, a silicon oxide film 2 is first formed on a silicon substrate 1 and then this silicon oxide film 2 is selectively etched away to form a contact hole 3.

Then, as shown in FIG. 1B, a titanium nitride film 4 is formed to cover a surface of the silicon oxide film 2 including sidewall and bottom of the contact hole 3.

Next, as shown in FIG. 1C, an aluminum film 5 is deposited on a surface including that of the contact hole by a CVD method with the growth chamber pressure of 1.3 Torr and the carrier hydrogen flow rate of 300 SCCM using dimethylaluminum hydride as a source material, whereby the inside of the contact hole is -filled with the aluminum film 5.

Figure 2:
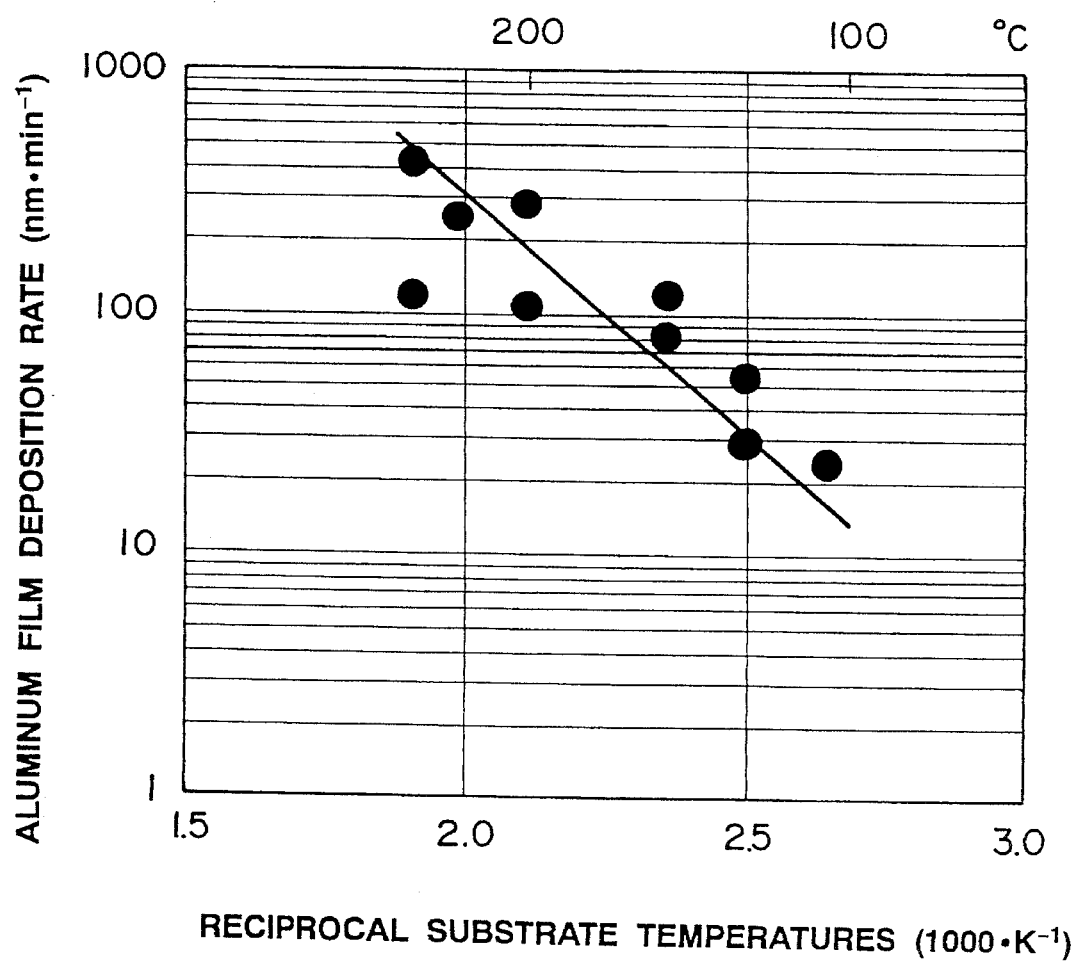
FIG. 2 is a graph showing the characteristics of dependence of the deposition rate on the reciprocal substrate temperatures when the aluminum film is deposited on a titanium nitride film according to the invention.

FIG. 2 shows in graph the dependence of the deposition rate on the reciprocal substrate temperatures when the aluminum film is deposited on a titanium nitride film according to the invention.

As seen in FIG. 2, in order to deposit an aluminum film with good step-coverage in the contact hole having the diameter of 0.3 μm and the aspect ratio of 2.7 and to fill inside the contact hole, the deposition rate of the aluminum film to fill the contact hole having the aspect ratio of 2.7 is lower than 34 nm/min from the above equation (2) since the maximum deposition rate is about 400 nm/min. Thus, by performing the CVD process with the deposition rate of about 30 nm/min under the substrate temperature of 130° C., it has been possible to obtain an aluminum film having an excellent step-coverage. Also, at the substrate temperature of 230° C. which is 100° C. higher than above and which corresponds to the deposition rate of about 300 nm/min, the step-coverage has deteriorated, thus demonstrating the criticality of the conditions according to the invention.

Also, it is noted that the aluminum film is not deposited under the substrate temperatures of below about 100° C. so that, in practical applications, the lower limit in the substrate temperature is about 100° C.

Thereafter, the aluminum film 5 thus formed is patterned and the interconnect is formed.

In the embodiment, the organic aluminum used may be any of dimethylaluminum hydride, tri-isobutyl aluminum, trimethylamine-alane, diethylaluminum hydride, triethylamine-alane and trimethylaluminum, or any of compounds of such organic aluminum. Also, the refractory metal film or the refractory metal compound film may be any of a titanium nitride film, a titanium film and a titanium tungsten film.

While the invention has been described in its preferred embodiment, it is to be understood that the words which have been used are words of description rather than limitation and that changes within the purview of the appended claims may be made without departing from the true scope and spirit of the invention in its broader aspects.

What is claimed is:

1. A method for forming an interconnect which includes an interconnect hole having a depth/diameter aspect ratio $\alpha$ larger than 1, said method comprising the steps of:

providing said interconnect hole on a surface of a semiconductor substrate;

covering a surface including a surface of said interconnect hole with a film of one of refractory metal and refractory metal compound; and depositing on the covered surface an aluminum film grown by a chemical vapor deposition process using dimethylaluminum hydride as a source material at a substrate temperature selected such that a ratio between a rate of deposition and a maximum deposition rate becomes $1/(1+4\alpha)$, said maximum deposition rate being a maximum rate of deposition obtained when all film formation conditions other than said substrate temperature are unchanged.

2. A method for forming an interconnect according to claim 1, in which said interconnect hole is a contact hole.

3. A method for forming an interconnect according to claim 1, in which said interconnect hole is a via-hole.

4. A method for forming an interconnect according to claim 1, in which said film of refractory metal is a titanium film.

5. A method for forming an interconnect according to claim 1, in which said film of refractory metal compound is a film of titanium nitride.

6. A method for forming an interconnect according to claim 1, in which said film of refractory metal compound is a film of titanium tungsten.

7. A method for forming an interconnect according to claim 1, wherein a lower limit of said substrate temperature is 100° C. and an optimum substrate temperature is about 130° C., said optimum temperature being a temperature at which said interconnect hole is covered by TiN, has an aspect ratio $\alpha$ of about 3, and is filled with uniform step coverage utilizing a chemical vapor deposition process using dimethylaluminum hydride.

* * * * *